(12) United States Patent
Mann et al.

(10) Patent No.: US 8,610,877 B2
(45) Date of Patent: Dec. 17, 2013

(54) IMAGING OPTICAL SYSTEM AND PROJECTION EXPOSURE INSTALLATION FOR MICROLITHOGRAPHY WITH AN IMAGING OPTICAL SYSTEM OF THIS TYPE

(75) Inventors: Hans-Juergen Mann, Oberkochen (DE); David Shafer, Fairfield, CT (US)

(73) Assignee: Carl Zeiss SMT GmbH, Oberkochen (DE)

(*) Notice: Subject to any disclaimer, the term of this patent is extended or adjusted under 35 U.S.C. 154(b) by 226 days.

(21) Appl. No.: 13/197,445

(22) Filed: Aug. 3, 2011

(65) Prior Publication Data
US 2012/0008124 A1 Jan. 12, 2012

Related U.S. Application Data

(63) Continuation of application No. PCT/EP2010/000795, filed on Feb. 10, 2010.

(60) Provisional application No. 61/151,871, filed on Feb. 12, 2009, provisional application No. 61/159,648, filed on Mar. 12, 2009.

(30) Foreign Application Priority Data

Feb. 12, 2009 (DE) .......................... 10 2009 008 644

(51) Int. Cl.
*G03B 27/70* (2006.01)
*G03B 27/68* (2006.01)
*G03B 27/00* (2006.01)
*G03B 27/54* (2006.01)
*G03B 27/42* (2006.01)
*G03B 27/52* (2006.01)
*G03B 27/32* (2006.01)

(52) U.S. Cl.
USPC .................. 355/66; 355/52; 355/53; 355/55; 355/57; 355/67; 355/77

(58) Field of Classification Search
USPC ................. 355/52, 53, 55, 57, 60, 66–71, 77; 250/492.1, 492.2, 492.22, 493.1, 548; 430/3, 5, 8, 22, 30, 311, 312, 321; 359/363–366, 857–859, 861, 869
See application file for complete search history.

(56) References Cited

U.S. PATENT DOCUMENTS 5,815,310 A * 9/1998 Williamson .................. 359/365
6,072,852 A * 6/2000 Hudyma ......................... 378/34
(Continued)

FOREIGN PATENT DOCUMENTS

CN 101088039 12/2007
CN 101221279 A 7/2008
(Continued)

OTHER PUBLICATIONS

English translation of JP2004-252359, published on Sep. 9, 2004.*
(Continued)

*Primary Examiner* — Toan Ton
*Assistant Examiner* — Christina Riddle
(74) *Attorney, Agent, or Firm* — Fish & Richardson P.C.

(57) ABSTRACT

An imaging optical system has a plurality of mirrors, which via a beam path for imaging light, image an object field in an object plane into an image field in an image plane. The imaging optical system has an exit pupil obscuration. At least one of the mirrors has no opening for passage of the imaging light. The fourth to last mirror in the beam path is concave, resulting in an imaging optical system having improved imaging properties without compromise in throughput.

20 Claims, 5 Drawing Sheets

(56) References Cited

U.S. PATENT DOCUMENTS

| | | | |
|---|---|---|---|
| 6,318,869 | B1 | 11/2001 | Hudyma |
| 6,710,917 | B2* | 3/2004 | Mann et al. ............... 359/365 |
| 6,750,948 | B2* | 6/2004 | Omura ....................... 355/53 |
| 6,975,385 | B2 | 12/2005 | Ohsaki et al. |
| 2003/0147131 | A1* | 8/2003 | Terasawa .................. 359/366 |
| 2003/0169411 | A1 | 9/2003 | Ota |
| 2004/0114217 | A1* | 6/2004 | Mann et al. ............... 359/366 |
| 2004/0223130 | A1* | 11/2004 | Hatakeyama et al. ...... 355/67 |
| 2006/0232867 | A1* | 10/2006 | Mann et al. ............... 359/858 |
| 2007/0058269 | A1* | 3/2007 | Mann et al. ............... 359/726 |
| 2008/0118849 | A1 | 5/2008 | Chandhok et al. |
| 2008/0137183 | A1 | 6/2008 | Mann et al. |
| 2008/0165415 | A1* | 7/2008 | Chan et al. ............... 359/351 |
| 2008/0170310 | A1* | 7/2008 | Mann ......................... 359/839 |
| 2008/0316451 | A1 | 12/2008 | Mann et al. |
| 2012/0236282 | A1 | 9/2012 | Mann |

FOREIGN PATENT DOCUMENTS

| | | |
|---|---|---|
| CN | 101226272 A | 7/2008 |
| CN | 101263430 A | 9/2008 |
| EP | 07 79 528 | 6/1997 |
| EP | 1093021 | 4/2001 |
| EP | 1950594 | 7/2008 |
| JP | 2001185480 | 7/2001 |
| JP | 2003233001 A | 8/2003 |
| JP | 2008176326 A | 7/2008 |
| JP | 2004252359 A | 8/2012 |

OTHER PUBLICATIONS

Japanese Office Action, with English translation, issued in Japanese Application No. JP2011-549476, dated Dec. 26, 2012.

English translation of German Examination Report for corresponding DE Appl No. 10 2009 008 644.7-51, dated Sep. 30, 2009.

International Search Report for corresponding PCT Appl No. PCT/EP2010/000795, dated May 20, 2010.

Korean Office Action, with translation thereof, for corresponding KR Appl No. 10-2011-7020216, dated Apr. 16, 2013.

Chinese office action, with English translation thereof, for corresponding CN Appl No. 2010 8000 7425.5, dated May 6, 2013.

Chinese office action, with translation thereof, for corresponding CN Appl No. 201080007424.0, dated May 31, 2013.

* cited by examiner

IMAGING OPTICAL SYSTEM AND PROJECTION EXPOSURE INSTALLATION FOR MICROLITHOGRAPHY WITH AN IMAGING OPTICAL SYSTEM OF THIS TYPE

CROSS-REFERENCE TO RELATED APPLICATIONS

This application is a continuation of, and claims benefit under 35 USC 120 to, international application PCT/EP2010/000795, filed Feb. 10, 2010, which claims benefit under 35 USC 119 of German Application No. 10 2009 008 644.7, filed Feb. 12, 2009 and under 35 USC 119(e) of U.S. Ser. No. 61/151,871, filed Feb. 12, 2009 and U.S. Ser. No. 61/159,648, filed Mar. 12, 2009. International application PCT/EP2010/000795 is hereby incorporated by reference in its entirety.

FIELD

The disclosure relates to an imaging optical system including a plurality of mirrors, which image an object field in an object plane in to an image field in an image plane along a beam path for imaging light, wherein the imaging optical system includes a pupil obscuration. Furthermore, the disclosure relates to a projection exposure installation for microlithography including an imaging optical system of this type, a method for producing a microstructured component including a projection exposure installation of this type, and a microstructured component produced with this method.

BACKGROUND

Imaging optical systems are known from US 2008/0170310 A1, US 2006/0232867 A1 and U.S. Pat. No. 6,750,948 B2. Another imaging optical system is known from U.S. Pat. No. 6,975,385 B2.

SUMMARY

There is a desire to improve imaging properties, for example increase numerical aperture to achieve higher resolution or better correction of imaging errors, in imaging optical systems, such as those used in projection exposure installations for microlithography, particularly for producing microstructured or nano-structured semiconductor components. Desirably, the imaging properties are improved without compromising throughput of the imaging optical system. This in particular is demanding regarding imaging optical systems working with EUV imaging light in the range between 5 nm and 30 nm.

The disclosure provides an imaging optical system, that can be used in a projection exposure installation for microlithography, wherein the imaging optical system exhibits improved imaging properties without compromise in throughput.

It has been found in accordance with the disclosure that a concave fourth to last mirror in the beam path leads to the possibility of designing the imaging optical system with low maximum angles of incidence on the respective mirrors. High reflection coatings therefore are possible with only low tolerance in band width of allowable angles of incidence. An imaging optical system having low losses and therefore a high throughput is the result. The image plane of the imaging optical system can be an intermediate image plane which is imaged into another image plane via a relay optics including e.g. two additional mirrors. A pupil obscuration means that at least one pupil plane of the imaging optical system has an area which is, regarding an unfolded beam path, not penetrated by the imaging light. The pupil obscuration may be a central pupil obscuration or a decentred pupil obscuration. The pupil obscuration may be a rotational symmetric pupil obscuration. In particular, the pupil obscuration may be an annular pupil obscuration. The field size on a high apertured side of the imaging optical system which as a rule is the image side, may have an area which is spanned up by two dimensions, the lower of which is at least 1 mm. This lower dimension may be at least 2 mm or may be even larger. In general, a pupil of an imaging optics is defined as an image of an aperture limiting the optical path of the imaging light. Those planes, wherein these aperture images are located, are designated as pupil planes. As the images of the aperture stop are not necessarily plane images, more generally all planes which approximately coincide with these aperture images are designated as pupil planes. The plane of the aperture stop itself also is designated as a pupil plane. If the aperture stop does not define a plane, by definition, as is done in the case of the images of the aperture stop, those planes which approximately coincide with the aperture stop are designated as pupil planes. The mirrors of the imaging optical system may be designed with free-form reflective surfaces which cannot be described by a rotationally symmetrical function. At least one of the mirrors of the imaging optical system may have a free-form reflection surface of this type.

An entrance pupil of the imaging optics is the image of the aperture stop which is formed by imaging the aperture stop via that part of the imaging optics which is located between the object plane and the aperture stop. Consequently, the exit pupil is defined as being the image of the aperture stop which is formed by imaging the aperture stop via that part of the imaging optics which is located between the image plane and the aperture stop.

When the entrance pupil is a virtual image of the aperture stop, i.e., if the entrance pupil plane is located in the beam path of the imaging light before the object field, this is known as a negative input back focal length or a negative back focal length of the entrance pupil. In that case, the chief rays of all object field points propagate as if having an origin from a point being located before the object field, i.e. outside the beam path between the object field and the image field. The chief ray of each object point is defined as a ray connecting a given object point and the center of the entrance pupil. Given a negative input back focal length of the entrance pupil the chief rays of all object field points run divergently at the object field.

A shaded or obscured exit pupil at an image point means that this image point cannot be reached by all rays which originate from a respective object point within the aperture. This means that there is an area within the exit pupil which cannot be reached by rays originating from this field point. This area defines the pupil obscuration.

An alternative definition of a pupil is that area in the optical path of the imaging optics, in which individual rays originating from the object field points intersect, these individual rays being chosen such that they have, in relation to the chief rays originating from these object field points, the same illumination angle, respectively. Regarding this alternative definition, a pupil plane is that plane, in which the intersection points of the individual rays according to this alternative pupil definition are located or is defined as that plane which approximates a spatial distribution of the intersection points which does not necessarily lie exactly in a plane.

A beam path can lead to the possibility to guide the image light between the third to last and the second to last mirror near a central optical axis of the imaging optical system leading to smallest possible through-openings in the image side obscuration mirrors of the imaging optical system. Further, this helps to achieve low maximum angles of incidence on the respective mirrors. The normal to the image field can be a common axis of rotational symmetry of the reflection surfaces of the mirrors of the imaging optical system or a common axis of rotational symmetry of best fit surfaces to approximate these reflection surfaces. The image field may be a ring segment field, i.e. may have the form of a part of an annulus. In that case, the center of such an image field which is the model point for the normal is defined as the middle point of the field range along a mirror axis of symmetry of such a ring segment field.

An intermediate image plane can help to avoid obstruction problems in certain sections of the beam path as in the vicinity of the intermediate image plane the beam path has a small cross section. Furthermore, an intermediate image generates an additional pupil plane of the imaging optical system that can alternatively be used as a position for an aperture stop or an obscuration defining element.

Locations of the intermediate image plane can help to avoid obstructions in the beam path prior to the passage through the last mirror which as a rule has a through-opening for pupil plane obscuration. To avoid such obstructions of the imaging light prior to the passage through the mirror, the intermediate image plane may be located at a spatial distance in front of the last mirror which is more than 20% of the distance between the object plane and the image plane, more than 30%, more than 33%, more than 40%, more than 50%, more than 60% and even more than 65%. The spatial distance according is not measured along the beam path but is the real distance between the intermediate image plane and the last mirror within the imaging optical system.

An intermediate pupil plane can lead to the possibility to arrange a pupil obscuration stop on this mirror.

An imaging optical system having exactly six mirrors leads to a well-balanced compromise between high quality imaging properties on the one hand and high throughput on the other. The imaging optical systems may be a catoptric imaging optical system.

An image side numerical aperture of at least 0.4 leads to a high resolution of the imaging optical system. The image side numerical aperture may be as high as 0.45 or maybe even higher.

A large image field can serve to achieve a high throughput of the imaging optical system.

Maximal angles of incidence can give the possibility of the use of multilayer high reflection coatings on the mirrors. The maximum angle of incidence for the imaging light chief ray of the central object point on the fourth to last mirror may be 5° at most, 4° at most, 3.8° at most, 3° at most or even 2.3° at most. The maximum angle of incidence for the imaging light on the fourth to last mirror in the meridional plane of the imaging optical system may be 5° at most, 4.6° at most, 4° at most or even 3.5° at most.

Optical properties according can give high quality imaging properties. The maximum wave front error (rms) can be as low as 25 mλ. The maximum distortion can be as low as 10 nm, as low as 5 nm, as low as 2 nm or even as low as 1.2 nm.

The advantages of an optical system and of a projection exposure installation can correspond to those previously discussed with regard to the imaging optical system according to the disclosure. The light source of the projection exposure installation may be in the form of a broadband light source and may have, for example, a bandwidth greater than 1 nm, greater than 10 nm or greater than 100 nm. In addition, the projection exposure installation may be constructed in such a way that it can be operated with light sources of different wavelengths. Light sources for other wavelengths, in particular wavelengths used for microlithography, can be used in conjunction with the imaging optical system according to the disclosure, for example light sources with wavelengths of 365 nm, 248 nm, 193 nm, 157 nm, 126 nm and 109 nm, and in particular also with wavelengths which are less than 100 nm.

Corresponding advantages also apply to a production method and a microstructured or nanostructured component produced thereby.

BRIEF DESCRIPTION OF THE DRAWINGS

Embodiments of the disclosure will be described in the following in greater detail with reference to the drawings, in which.

Figure 1:
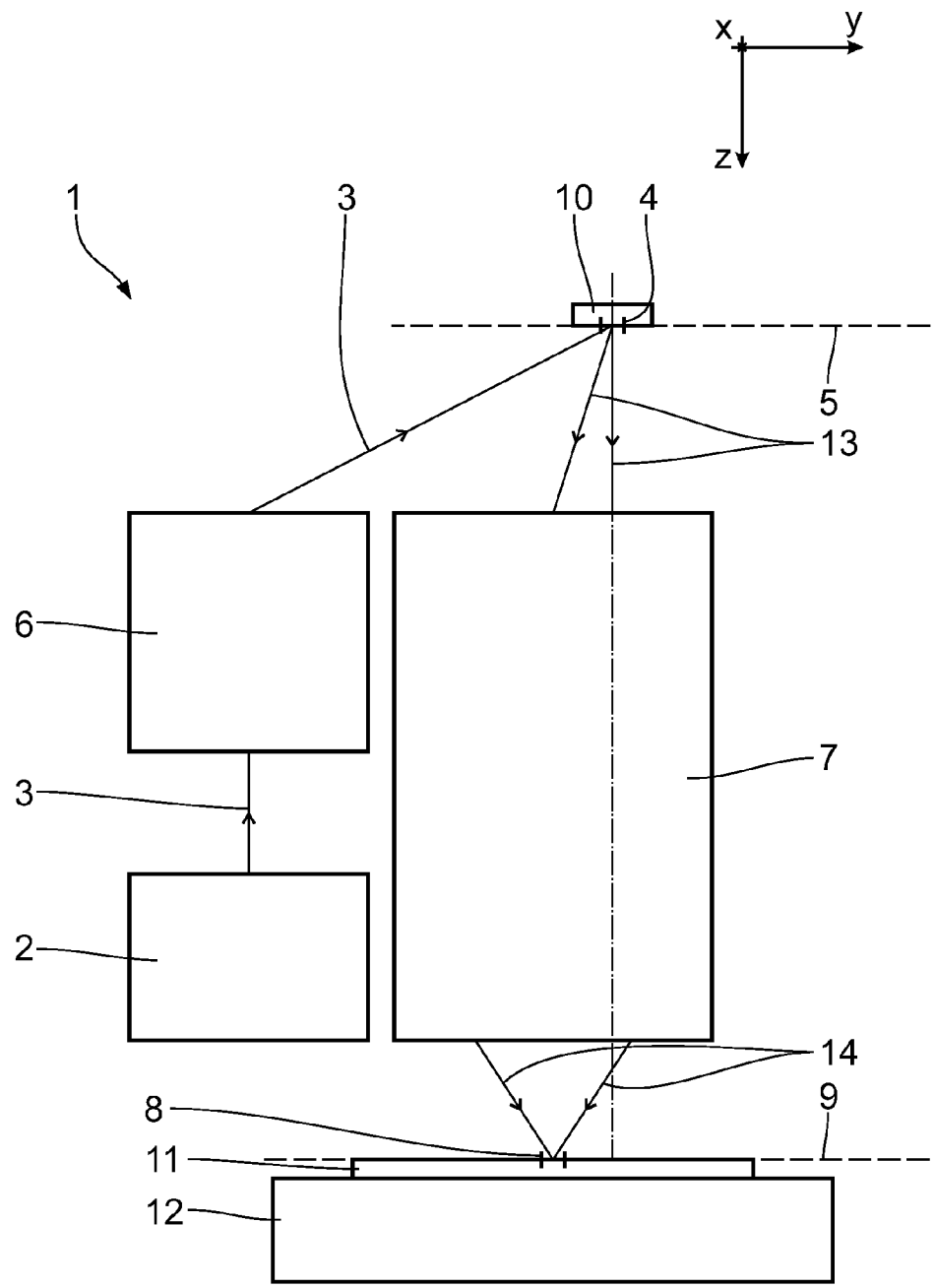
FIG. 1 is a schematic view of a projection exposure installation for EUV microlithography having an imaging optical system to image an object field in an object plane into an image field in an image plane.

A projection exposure installation 1 for microlithography has a light source 2 for illumination light. The light source 2 is an EUV light source which produces illumination and imaging light 3 in a wavelength range in particular of between 5 nm and 30 nm. Other EUV wavelengths are also possible. In general, any desired wavelengths, for example visible wavelengths or any other wavelengths which are used, for example, in microlithography and are available for the appropriate laser light sources and/or LED light sources (for example 365 nm, 248 nm, 193 nm, 157 nm, 129 nm or 109 nm), are possible for the illumination light guided in the projection exposure installation 1. A beam path of the illumination light 3 is shown extremely schematically in FIG. 1.

An illumination optical system 6 guides the illumination light 3 from the light source 2 to an object field 4 (cf. FIG. 2) in an object plane 5. The object field 4 is imaged into an image field 8 (cf. FIG. 2) in an image plane 9, at a pre-specified reduction scale, with a projection optical system or an imaging optical system 7. One of the embodiments shown in FIGS. 2 to 5 may be used for the projection optical system 7. The projection optical system 7 of FIG. 2 has a reduction factor of 4. Other reduction scales are also possible, for example 5×, 8×, or even reduction scales that are greater than 8×. In the projection optical system 7 in the embodiments of FIGS. 2 to 5, the image plane 9 is arranged parallel to the object plane 5. A portion of the reflective mask 10, also known as a reticle, coinciding with the object field 4 is hereby imaged.

In order to aid the description of the projection exposure installation 1 and the various embodiments of the projection optical system 7, a xyz Cartesian coordinate system is provided in the drawings and indicates the respective locations of the components represented in the figures. In FIG. 1, the x direction extends perpendicular to and into the drawing plane. The y direction extends to the right and the z direction extends downwards.

The image field 8 is bent in an arc shape, the y distance between the two arcs which delimit the image field 8 being 2 mm. 2 mm is also the side length of the straight side edges which delimit the image field 8 between the two arcs and which extend parallel to one another in y direction. These two straight side edges of the image field 8 are at a distance of 26 mm from one another. The surface of this curved image field corresponds to a rectangular image field with side lengths of 2 mm×26 mm. A rectangular image field 8 or any other shape having e.g. these dimensions is also possible, in particular when using a non-rotationally symmetric optical surface of at least one of the mirrors of the imaging optical system 7, a so-called free-form surface, is used.

Imaging takes place on the surface of a substrate 11 in the form of a wafer which is supported by a substrate holder 12. In FIG. 1, a light beam 13 of the illumination light 3 entering the projection optical system 7 is shown schematically between the reticle 10 and the projection optical system, and a light beam 14 of the illumination light 3 exiting from the projection optical system 7 is shown schematically between the projection optical system 7 and the substrate 11.

The projection exposure installation 1 is a scanner-type device. Both the reticle 10 and the substrate 11 are scanned in the y direction during operation of the projection exposure installation 1.

Figure 2:
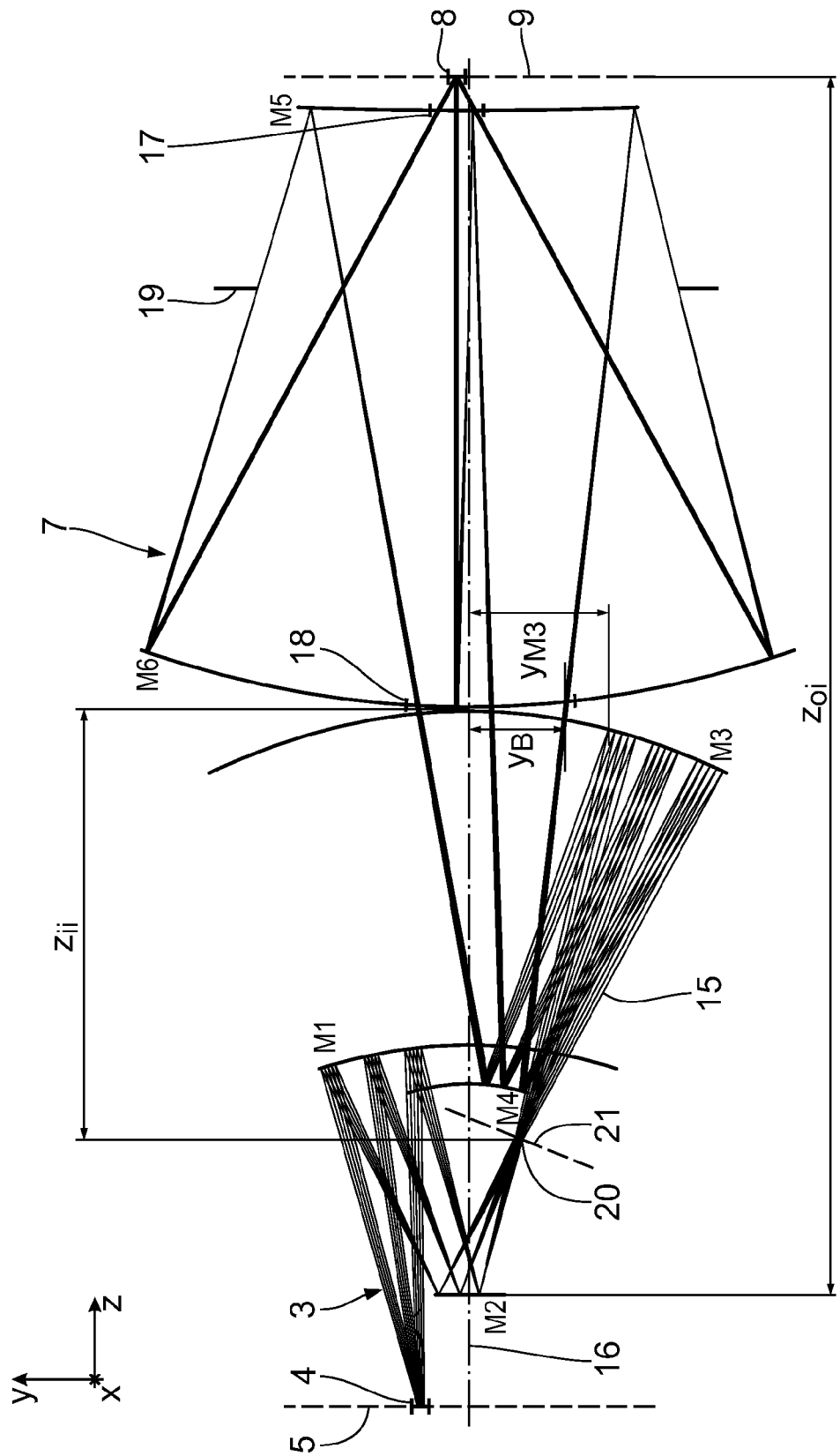
FIGS. 2 to 5 are embodiments of the imaging optical system, each in meridional section.

FIG. 2 shows the optical construction of a first embodiment of the projection optical system 7. The beam path of each of three individual rays 15 of the imaging light 3, which proceed in each case from five object field points in FIG. 2 and are distanced from one another in the y direction, is shown. The three individual rays 15, which belong to one of these five object field points, are each associated with three different illumination directions for the five image field points. The individual rays 15, associated with the same illumination direction, of different field points extend divergently proceeding from the object plane 5. This is also referred to in the following as a negative input back focal length or a negative back focal length of the entrance pupil. Thus, an entrance pupil of the projection optical system 7 of FIG. 2 lies not inside the projection optical system 7, but before the object plane 5 in the beam path of the imaging light 3. This makes it possible, for example, to arrange a pupil component of the illumination optical system 6 in the entrance pupil of the projection optical system 7, before the projection optical system 7 in the beam path, without further imaging optical components having to be present between these pupil components and the object plane 5. As alternatives to a negative back focal length of the entrance pupil, variations of the imaging optical system 7 having a positive back focal length of the entrance pupil or an infinite distance between entrance pupil and object plane, i.e. a telecentric object side design, are possible.

The projection optical system 7 of FIG. 2 has a total of six mirrors, which are numbered in the sequence of the beam path, proceeding from the object field 4, as M1 to M6. FIG. 2 shows only calculated reflection surfaces of the mirrors M1 to M6.

The optical data for the projection optical system 7 of FIG. 2 are shown in the following two tables. In the column "radius", the first table shows in each case the radius of curvature of the mirrors M1 to M6. The third column (thickness) describes the distance, proceeding from the object plane 5, to the following surface in each case.

The second table describes the precise surface form of the reflection surfaces of the mirrors M1 to M8, where the constants K and A to G are to be put into the following equation for the sagittal height z (h):

$$z(h) == \frac{ch^2}{1 + SQRT\{1 - (1+K)c^2h^2\}} + +Ah^4 + Bh^6 + Ch^8 + Dh^{10} + Eh^{12} + Fh^{14} + Gh^{16}$$

In this case, h represents the distance from an optical axis 16. Therefore: $h^2 = x^2 + y^2$. The reciprocal of "radius" is used for c.

| Surface | Radius | Thickness | Mode |
|---|---|---|---|
| Object | INFINITY | 467.886 | |
| Mirror 1 | −510.946 | −324.122 | REFL |
| Mirror 2 | 3365.394 | 753.754 | REFL |
| Mirror 3 | −647.263 | −480.301 | REFL |
| Mirror 4 | −222.580 | 1255.523 | REFL |
| Mirror 5 | 4218.871 | −227.647 | REFL |
| STOP | INFINITY | −542.276 | |
| Mirror 6 | 1084.616 | 814.923 | REFL |
| Image | INFINITY | 0.000 | |

| Surface | K | A | B | C |
|---|---|---|---|---|
| Mirror 1 | 0.000000E+00 | 1.436904E−10 | −1.602611E−16 | −9.147843E−20 |
| Mirror 2 | 0.000000E+00 | 1.416920E−08 | −1.117413E−12 | 2.275422E−16 |
| Mirror 3 | 0.000000E+00 | −1.236913E−11 | −1.820658E−16 | 2.300485E−21 |
| Mirror 4 | 0.000000E+00 | 4.444710E−09 | −3.135012E−13 | −7.757698E−17 |
| Mirror 5 | 0.000000E+00 | 3.973934E−10 | 6.412337E−16 | 1.482318E−21 |
| Mirror 6 | 0.000000E+00 | 2.123517E−11 | 2.309893E−17 | 2.197829E−23 |

| Surface | D | E | F | G |
|---|---|---|---|---|
| Mirror 1 | 3.887094E−24 | −8.181187E−29 | 6.797763E−34 | 0.000000E+00 |
| Mirror 2 | −1.998702E−20 | −3.279633E−34 | −1.670474E−27 | 0.000000E+00 |
| Mirror 3 | −2.577499E−26 | 1.435734E−31 | −3.354166E−37 | 0.000000E+00 |
| Mirror 4 | 2.411333E−20 | −3.562294E−24 | 2.033322E−28 | 0.000000E+00 |
| Mirror 5 | 4.731862E−27 | −1.087252E−32 | 4.275112E−37 | −2.496780E−42 |
| Mirror 6 | 1.996269E−29 | 2.248910E−35 | −2.392841E−43 | 5.656688E−47 |

The projection optical system 7 has exactly six mirrors M1 to M6. The projection optical system 7 is a catoptrical optical system.

The mirrors M5 and M6 are obscured, i.e. these mirrors M5, M6 have through-openings 17, 18, respectively. Due to this obscuration, an exit pupil of the projection optical system 7 in an exit pupil plane 19 is obscured, i.e., regarding the unfolded beam path, in a portion, in this case in a central area, is not penetrated by the imaging light 3.

Mirrors M1, M3 and M6 are concave. In particular, mirror M3 which is the fourth to last mirror in the beam path of the projection optical system 7, is concave.

Mirrors M4 and M5 are convex. Mirror M2 also is concave but has a very large radius of curvature as compared to its used reflective surface thus appearing as an approximately plane mirror in FIG. 2.

The image field-side numerical aperture of the projection optical system 7 in accordance with FIG. 2 is 0.45. This is not reproduced to scale in FIG. 1.

The beam path between the third to last mirror M4 and the second to last mirror M5 passes the fourth to last mirror M3 at a distance $y_B$ to the optical axis 16, i.e. to a normal to the image plane 9 which is smaller than a distance $y_{M3}$ of the fourth to last mirror M3 to the normal, i.e. to the optical axis 16, to the image plane 9. Thus, the beam path passes the last mirror M6 approximately symmetrical to the optical axis 16 minimizing the width of the through-opening 18 and therefore minimizing the pupil obscuration of the projection optical system 7. Comparing the distances $y_B$, $y_{M3}$ as mentioned above, it can be seen clearly from FIG. 2 that also the distance of the beam path between the third to last mirror M4 and the second to last mirror M5, where this beam path passes the fourth to last mirror M3, to a normal to the center of the image field 8 is smaller than the distance of the fourth to last mirror M3 to the normal to the image field 8.

A first intermediate pupil plane in the beam path of the projection optical system 7 is located in the vicinity of mirror M2. An intermediate image 20 in the beam path between the object plane and the image plane 9 is located between the fifth to last mirror M2 and the fourth to last mirror M3 in an intermediate image plane 21. Thus, the intermediate image 20 is located in the beam path in front of the third to last mirror M4 and also in front of the fourth to last mirror M3. The intermediate image 20 is located at a spatial distance $z_{ii}$ in front of the last mirror M6, which is more than 10% of the distance $z_{oi}$ between the object plane 5 and the image plane 9 which is also known as track length. In the embodiment of FIG. 2, the ratio $z_{ii}/z_{oi}$ is about 0.33.

A maximum angle of incidence for an imaging light chief ray of a central object point on the fourth to last mirror M3 is 2.3°. A chief ray is defined as a ray in the beam path of the projection optical system 7 which centrally passes the pupil planes of the projection optical system 7. Of course, the beam paths of these chief rays are not used as they are obscured.

A maximum angle of incidence for the imaging light 3 on the fourth to last mirror M3 in the meridional plane of the projection optical system 7 is 3.5°.

The projection optical system 7 has a maximum wavefront error of 25 mλ with respect to a wavelength of 13.5 nm.

The projection optical system 7 has a maximum distortion of 1.2 nm.

Figure 3:
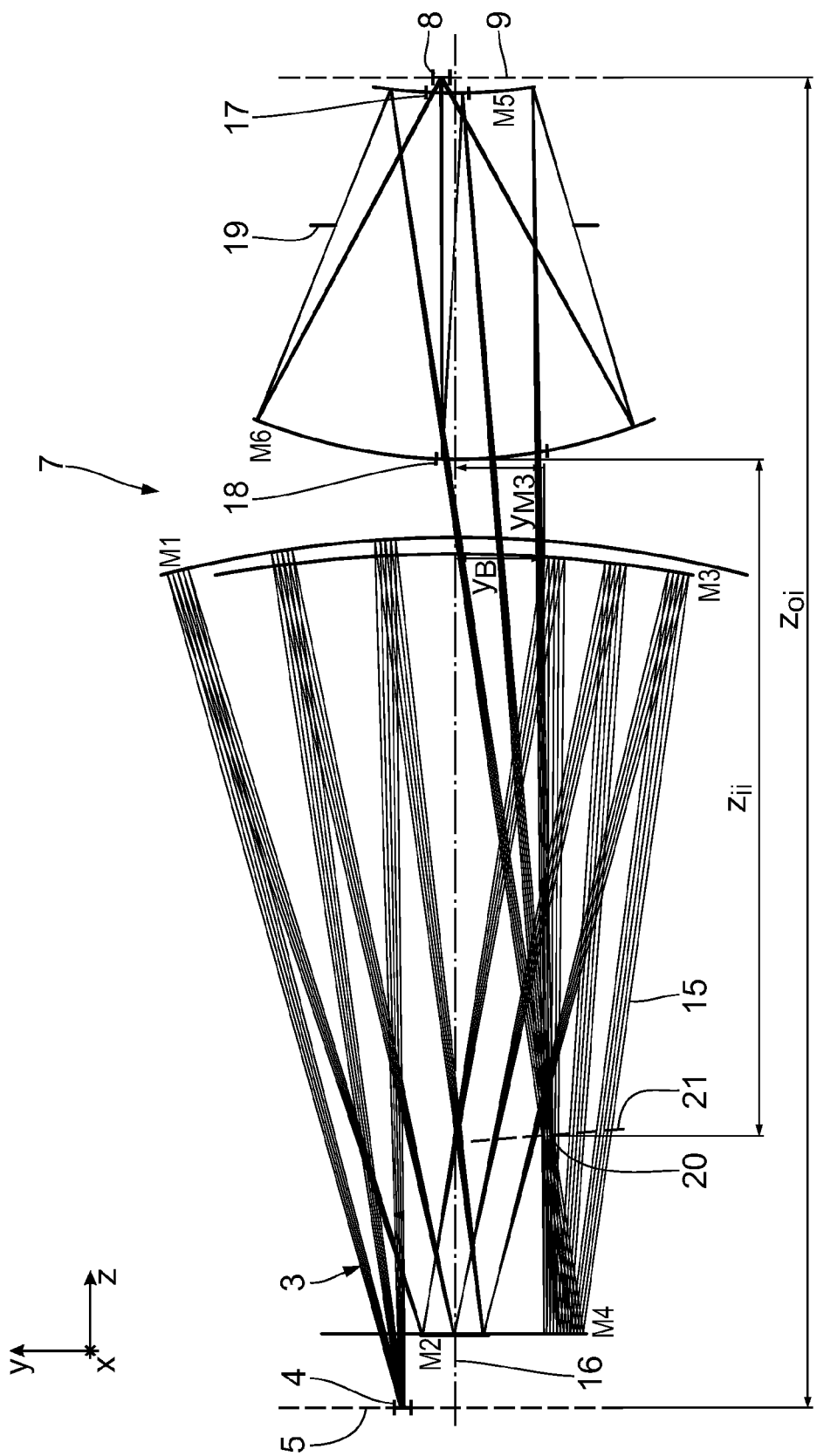

FIG. 3 shows a further embodiment of a projection optical system 7. Components and features which correspond to those which have previously been described with reference to FIGS. 1 and 2 have the same reference numerals and will not be discussed in detail again.

The optical data for the projection optical system 7 of FIG. 3 are shown in the following two tables, which correspond in layout to the tables for FIG. 2.

| Surface | Radius | Thickness | Mode |
|---|---|---|---|
| Object | INFINITY | 1183.205 | |
| Mirror 1 | −1328.379 | −1083.205 | REFL |
| Mirror 2 | −575.284 | 1058.935 | REFL |
| Mirror 3 | −1592.286 | −1057.582 | REFL |
| Mirror 4 | 18198.201 | 1684.307 | REFL |
| Mirror 5 | 795.047 | −182.210 | REFL |
| STOP | INFINITY | −314.961 | |
| Mirror 6 | 630.195 | 517.171 | REFL |
| Image | INFINITY | 0.000 | |

| Surface | K | A | B | C |
|---|---|---|---|---|
| Mirror 1 | 0.000000E+00 | −6.649307E−12 | −4.302304E−18 | −8.848113E−24 |
| Mirror 2 | 0.000000E+00 | 6.282448E−09 | 6.011360E−13 | −3.791310E−17 |
| Mirror 3 | 0.000000E+00 | −6.195561E−12 | −2.166405E−17 | 4.405461E−22 |
| Mirror 4 | 0.000000E+00 | −1.260058E−10 | 3.471757E−15 | −1.438560E−19 |
| Mirror 5 | 0.000000E+00 | 3.711197E−09 | 3.364407E−14 | 3.306640E−19 |
| Mirror 6 | 0.000000E+00 | 6.440745E−11 | 1.979430E−16 | 5.542475E−22 |

| Surface | D | E | F | G |
|---|---|---|---|---|
| Mirror 1 | 5.943741E−29 | −2.958093E−34 | 5.813740E−40 | 0.000000E+00 |
| Mirror 2 | 1.010546E−21 | −1.002068E−33 | −6.370370E−27 | 1.558060E−30 |
| Mirror 3 | −6.624002E−27 | 5.921233E−32 | −2.942683E−37 | 6.268230E−43 |
| Mirror 4 | 3.141242E−24 | −1.800849E−29 | −5.645134E−34 | 8.168772E−39 |
| Mirror 5 | 7.350550E−24 | −1.994692E−28 | −2.272188E−33 | 3.986656E−37 |
| Mirror 6 | 8.640666E−28 | 1.466217E−32 | −1.024646E−37 | 5.046001E−43 |

In the projection optical system of FIG. 3, mirrors M1, M3 and M6 are concave. Mirrors M2 and M5 are convex. Mirror M4 has a very large radius and therefore appears to be approximately plane in FIG. 3.

Mirrors M2 and M4 lie approximately at the same z-position of projection optical system 7 of FIG. 3.

The projection optical system 7 of FIG. 3 has an image side numerical aperture of 0.45.

The beam path between mirrors M4 and M5 passes mirror M3 between the mirror M3 and the optical axis 16. Consequently, also in the projection optical system 7 of FIG. 3 the beam path between the third to last mirror M4 and the second to last mirror M5 passes the fourth to last mirror M3 at a distance $y_B$ to the optical axis 16 which is smaller than a distance $y_{M3}$ of the fourth to last mirror M3 to the optical axis 16. Also, the beam path between the third to last mirror M4 and the second to last mirror M5 passes the fourth to last mirror M3 at a distance to a normal to the image field 8 which is smaller than a distance of the fourth to last mirror M3 to this normal to the center of the image field 8 of the projection optical system 7 of FIG. 3.

The intermediate image 20 of the projection optical system 7 of FIG. 3 lies in the beam path between mirrors M4 and M5. This intermediate image 20 is located at a spatial distance $z_{ii}$ in front of the last mirror M6 which is more than 10% of the distance $z_{oi}$ between the object plane 5 and the image plane 9. In the embodiment of FIG. 3, the ratio $z_{ii}/z_{oi}$ is about 0.65.

A first intermediate pupil plane in the beam path between the object plane 5 and the image plane 9 lies in the vicinity of mirror M2. On this mirror M2 a pupil obscuration stop can be placed to define the pupil obscuration of the projection optical system 7 of FIG. 3.

A maximum angle of incidence for an imaging light chief ray of a central object point on the fourth to last mirror M3 is 3.8°.

A maximum angle of incidence for the imaging light 3 on the fourth to last mirror M3 in the meridional plane of the projection optical system 7 of FIG. 3 is 4.6°.

The projection optical system 7 of FIG. 3 has a maximum wave front error of 47 mλ. The projection optical system 7 of FIG. 3 has a maximum distortion of 5 nm.

Figure 4:
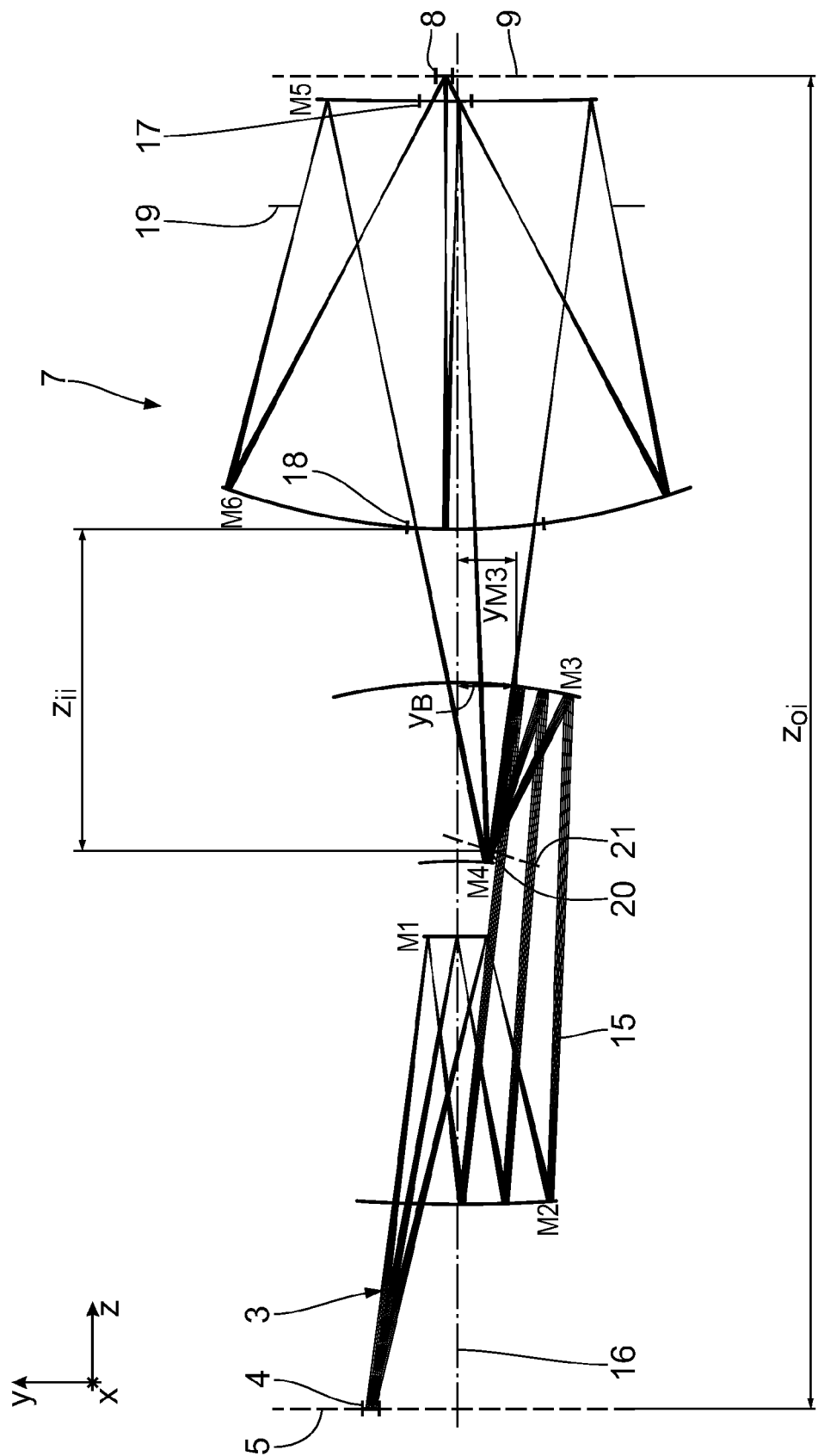

FIG. 4 shows a further embodiment of a projection optical system 7. Components and features which correspond to those which have previously been described with reference to FIGS. 1 to 3 have the same reference numerals and will not be discussed in detail again.

The optical data for the projection optical system 7 of FIG. 4 are shown in the following two tables, which correspond in layout to the tables for FIG. 2.

quently, also in the projection optical system 7 of FIG. 4 the beam path between the third to last mirror M4 and the second to last mirror M5 passes the fourth to last mirror M3 at a distance $y_B$ to the optical axis 16 which is smaller than a distance $y_{M3}$ of the fourth to last mirror M3 to the optical axis 16. Also, the beam path between the third to last mirror M4 and the second to last mirror M5 passes the fourth to last mirror M3 at a distance to a normal to the center of the image field 8 which is smaller than a distance of the fourth to last mirror M3 to this normal to the image field 8 of the projection optical system 7 of FIG. 4.

The intermediate image 20 of the projection optical system 7 of FIG. 4 lies in the vicinity of mirror M4. This intermediate image 20 is located at a spatial distance $z_{ii}$ in front of the last mirror M6 which is more than 10% of the distance $z_{oi}$ between the object plane 5 and the image plane 9. In the embodiment of FIG. 4, the ratio $z_{ii}/z_{oi}$ is about 0.24.

The individual rays 15, associated with the same illumination direction, of different field points extend convergently proceeding from the object plane 5 of the imaging or projection optical system 7 of FIG. 4. This is also referred to as a positive back focal length of the entrance pupil.

The first intermediate pupil plane in the beam path between the object plane 5 and the image plane 9 lies in the vicinity of mirror M1. On this mirror M1 a pupil obscuration stop can be placed to define the pupil obscuration of the projection optical system 7 of FIG. 4.

The chief ray angles for the central field point on each of the mirrors M1 to M6 are 9.7°, 6.9°, 6.6°, 9.6°, 1.8° and 0.9°, respectively. With respect to the central field point all chief ray angles of incidence on the mirrors M1 to M6 are smaller

| Surface | Radius | Thickness | Mode |
|---|---|---|---|
| Object | INFINITY | 799.524 | |
| Mirror 1 | −21793.63 | −451.274 | REFL |
| Mirror 2 | 1544.278 | 886.700 | REFL |
| Mirror 3 | −745.894 | −305.257 | REFL |
| Mirror 4 | −346.809 | 1288.433 | REFL |
| Mirror 5 | 15968.319 | −180.240 | REFL |
| STOP | INFINITY | −543.305 | |
| Mirror 6 | 1086.693 | 768.544 | REFL |
| Image | INFINITY | 0.000 | |

| Surface | K | A | B | C |
|---|---|---|---|---|
| Mirror 1 | 0.000000E+00 | 2.115219E−09 | 1.569479E−14 | 8.536232E−19 |
| Mirror 2 | 0.000000E+00 | −2.973633E−10 | 7.102254E−16 | −4.274832E−21 |
| Mirror 3 | 0.000000E+00 | 1.555252E−10 | 4.516776E−16 | −1.374152E−20 |
| Mirror 4 | 0.000000E+00 | −4.815282E−09 | 5.040254E−12 | −1.401315E−15 |
| Mirror 5 | 0.000000E+00 | 3.122473E−10 | 4.443090E−16 | 8.155899E−22 |
| Mirror 6 | 0.000000E+00 | 2.819557E−11 | 3.077126E−17 | 3.054059E−23 |

| Surface | D | E | F | G |
|---|---|---|---|---|
| Mirror 1 | −4.412914E−22 | 4.162560E−31 | 1.960635E−29 | 0.000000E+00 |
| Mirror 2 | 2.467142E−25 | −6.671143E−30 | 7.419380E−35 | 0.000000E+00 |
| Mirror 3 | 3.711994E−25 | −5.054858E−30 | 2.911858E−35 | 0.000000E+00 |
| Mirror 4 | 1.768816E−19 | 1.916495E−30 | −1.428438E−27 | 0.000000E+00 |
| Mirror 5 | 1.958046E−27 | 2.405983E−33 | 2.873232E−38 | −8.029814E−45 |
| Mirror 6 | 2.752062E−29 | 4.111797E−35 | −3.595583E−41 | 1.870027E−46 |

In the projection optical system of FIG. 4, mirrors M2, M3 and M6 are concave. Mirrors M4 and M5 are convex. Mirror M1 has a very large radius and therefore appears to be approximately plane in FIG. 4.

The image field-side numerical aperture of the projection optical system 7 of FIG. 4 is 0.45.

The beam path between mirrors M4 and M5 passes mirror M3 between the mirror M3 and the optical axis 16. Consethan 10°. The wave front error of the system has a composite rms value of 16 mλ. Distortion is corrected to values below 1 nm.

The projection optical system of FIG. 4 has a demagnification ratio of 8×, while the field size at wafer level, i.e. the image field size, is still 2 mm×26 mm.

Figure 5:
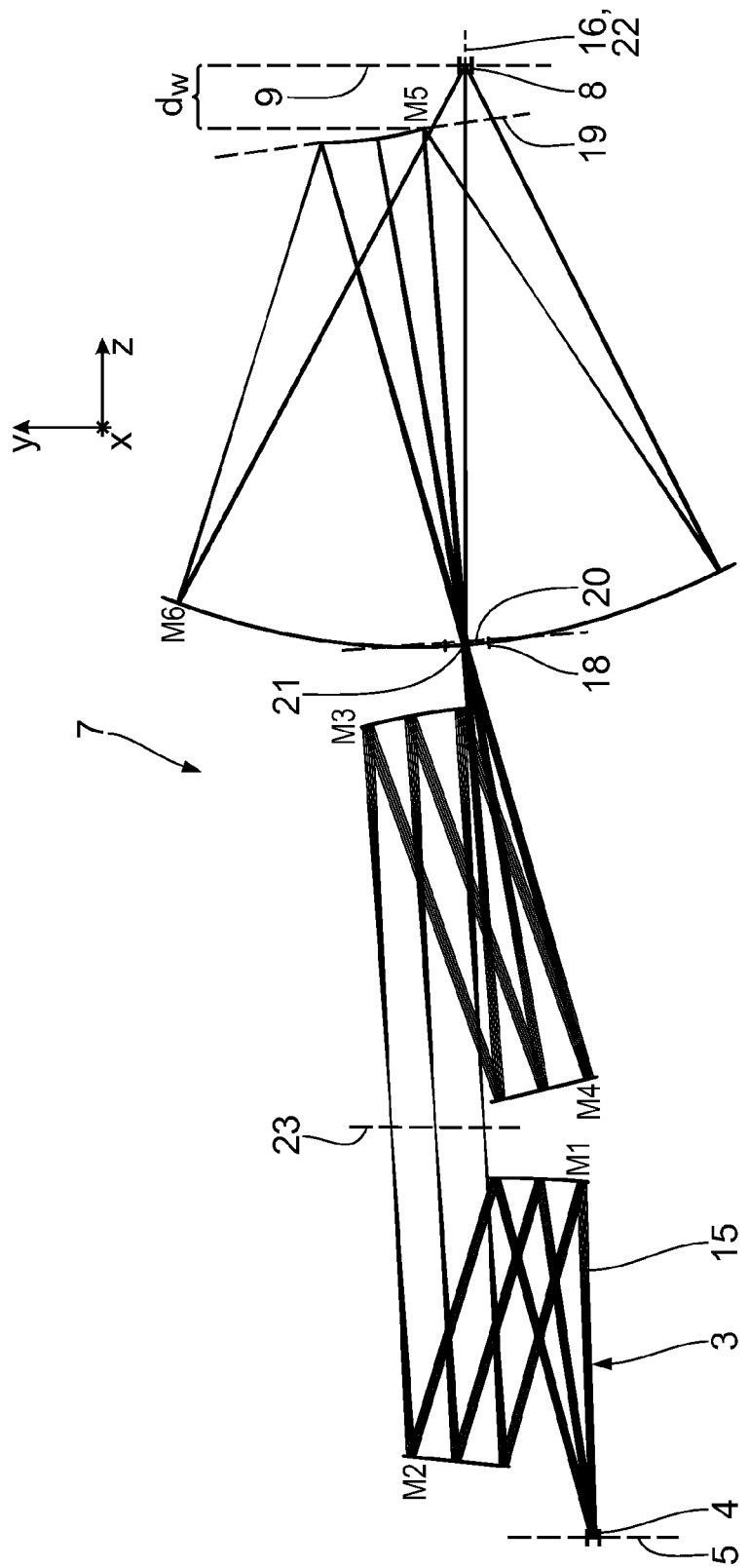

FIG. 5 shows a further embodiment of the projection optical system 7. Components which correspond to those which have already been described above with reference to the projection optical system 7 from FIGS. 2 to 4 have the same reference numerals and are not discussed again in detail.

All six mirrors M1 to M6 of the projection optical system 7 are designed as free-form faces which cannot be described by a rotationally symmetrical function. Other embodiments of the projection optical system 7 are also possible, in which at least one of the mirrors M1 to M6 has a free-form reflection face of this type.

A free-form face of this type may also be produced from a rotationally symmetrical reference face. Free-form faces of this type for reflection faces of the mirrors of projection optical systems of projection exposure installation for microlithography are known from US 2007-0058269 A1.

The free-form face can be described mathematically by the following equation:

$$Z = \frac{cr^2}{1+\sqrt{1-(1+k)c^2r^2}} + \sum_{j=2}^{N} C_j X^m Y^n \quad (1)$$

wherein there applies:

$$j = \frac{(m+n)^2 + m + 3n}{2} + 1 \quad (2)$$

Z is the rising height (sagitta) of the free-form face at the point x, y ($x^2+y^2=r^2$).
c is a constant, which corresponds to the vertex curvature of a corresponding asphere. k corresponds to a conical constant of a corresponding asphere. $C_j$ are the coefficients of the monomials $X^m Y^n$. Typically, the values of c, k and $C_j$ are determined on the basis of the desired optical properties of the mirror within the projection optical system 7. The order of the monomial, m+n, may be varied as desired. A monomial of a higher order may lead to a design of the projection optical system with improved image error correction, but is more complex to calculate. m+n may adopt values of between 3 and more than 20.

Free-form faces can also be described mathematically by Zernike polynomials, which are described, for example, in the manual of the optical design programme CODE V®. Alternatively, free-form faces may be described with the aid of two-dimensional spline surfaces. Examples of this are Bezier curves or non-uniform rational basis splines (NURBS). Two-dimensional spline surfaces may, for example, be described by a network of points in an xy-plane and associated z-values or by these points and gradients associated with them. Depending on the respective type of spline surface, the complete surface is obtained by interpolation between the network points using, for example, polynomials or functions, which have specific properties with regard to their continuity and differentiability. Examples of this are analytical functions.

The mirrors M1 to M6 have multiple reflection layers to optimise their reflection for the impinging EUV illumination light 3. The reflection can be optimised all the better, the closer the impingement angle of the individual beams 15 on the mirror surface lies to the perpendicular incidence. The projection optical system 7 has small reflection angles overall for all the individual beams 15.

The optical design data of the reflection faces of the mirrors M1 to M6 of the projection optical system 7 can be inferred from the following tables. The first of these tables gives, for the optical surfaces of the optical components and for the aperture diaphragm, the respective reciprocal value of the vertex curvature (radius) and a spacing value (thickness), which corresponds to the z-spacing of adjacent elements in the beam path, proceeding from the object plane. The second table gives the coefficients $C_j$ of the monomials $X^m Y^n$ in the free-form face equation given above for the mirrors M1 to M6. N radius is in this case a standardisation factor. According to the second table, the amount is still given in mm, along which the respective mirror, proceeding from a mirror reference design, has been decentred (Y-decentre) and rotated (X-rotation). This corresponds to a parallel displacement and a tilting in the free-form face design method. The displacement takes place here in the y-direction and the tilting is about the x-axis. The rotation angle is given in degrees here.

| Surface | Radius | Spacing value | Operating mode |
|---|---|---|---|
| Object plane | INFINITE | 485.884 | |
| M1 | 573.309 | −385.884 | REFL |
| M2 | 856.474 | 1014.613 | REFL |
| M3 | −619.480 | −508.729 | REFL |
| M4 | 601.504 | 1294.117 | REFL |
| M5 | 256.986 | −685.388 | REFL |
| M6 | 838.548 | 785.387 | REFL |
| Image plane | INFINITE | 0.000 | |

| Coefficient | M1 | M2 | M3 | M4 | M5 | M6 |
|---|---|---|---|---|---|---|
| K | −5.356880E−02 | 8.027989E−02 | 2.215137E+00 | −5.038784E−01 | 4.907814E−02 | 1.120410E−01 |
| Y | 0.000000E+00 | 0.000000E+00 | 0.000000E+00 | 0.000000E+00 | 0.000000E+00 | 0.000000E+00 |
| X2 | −4.675062E−04 | −2.669898E−05 | 1.839305E−03 | −2.126518E−04 | −9.700568E−04 | 7.232599E−06 |
| Y2 | −1.320900E−03 | −5.452804E−04 | 7.818071E−04 | −4.431611E−04 | −8.012468E−04 | 1.044012E−05 |
| X2Y | 1.229247E−06 | 4.121203E−07 | −2.381957E−06 | −9.694733E−08 | −1.199882E−06 | −5.510251E−09 |
| Y3 | −7.423640E−08 | −8.613636E−08 | 4.979224E−08 | −2.077214E−08 | 1.739231E−07 | −1.476529E−09 |
| X4 | −2.550932E−10 | −5.351417E−11 | 1.281481E−08 | −4.388472E−11 | −2.188996E−09 | 2.529523E−13 |
| X2Y2 | −2.178964E−10 | −2.067816E−10 | 8.488864E−09 | −1.254954E−10 | −2.292180E−09 | 2.688243E−13 |
| Y4 | −8.677437E−10 | −8.009610E−10 | 1.878436E−09 | −1.372181E−10 | −1.320127E−09 | 1.277954E−12 |
| X4Y | −3.215827E−13 | 1.670802E−13 | −1.372762E−10 | 4.754789E−14 | −6.365774E−12 | −2.679463E−16 |
| X2Y3 | −1.228117E−12 | 3.874349E−13 | −2.437182E−11 | −1.718101E−13 | −6.070058E−12 | −1.679816E−15 |
| Y5 | −1.148542E−13 | 2.500543E−13 | 1.577671E−12 | 5.427575E−13 | −6.442309E−12 | −1.838497E−15 |
| X6 | 0.000000E+00 | 0.000000E+00 | 0.000000E+00 | 0.000000E+00 | 0.000000E+00 | 0.000000E+00 |
| X4Y2 | 0.000000E+00 | 0.000000E+00 | 0.000000E+00 | 0.000000E+00 | 0.000000E+00 | 0.000000E+00 |
| X2Y4 | 0.000000E+00 | 0.000000E+00 | 0.000000E+00 | 0.000000E+00 | 0.000000E+00 | 0.000000E+00 |

-continued

| | | | | | | |
|---|---|---|---|---|---|---|
| Y6 | 0.000000E+00 | 0.000000E+00 | 0.000000E+00 | 0.000000E+00 | 0.000000E+00 | 0.000000E+00 |
| X6Y | 0.000000E+00 | 0.000000E+00 | 0.000000E+00 | 0.000000E+00 | 0.000000E+00 | 0.000000E+00 |
| X4Y3 | 0.000000E+00 | 0.000000E+00 | 0.000000E+00 | 0.000000E+00 | 0.000000E+00 | 0.000000E+00 |
| X2Y5 | 0.000000E+00 | 0.000000E+00 | 0.000000E+00 | 0.000000E+00 | 0.000000E+00 | 0.000000E+00 |
| Y7 | 0.000000E+00 | 0.000000E+00 | 0.000000E+00 | 0.000000E+00 | 0.000000E+00 | 0.000000E+00 |
| X8 | 0.000000E+00 | 0.000000E+00 | 0.000000E+00 | 0.000000E+00 | 0.000000E+00 | 0.000000E+00 |
| X6Y2 | 0.000000E+00 | 0.000000E+00 | 0.000000E+00 | 0.000000E+00 | 0.000000E+00 | 0.000000E+00 |
| X4Y4 | 0.000000E+00 | 0.000000E+00 | 0.000000E+00 | 0.000000E+00 | 0.000000E+00 | 0.000000E+00 |
| X2Y6 | 0.000000E+00 | 0.000000E+00 | 0.000000E+00 | 0.000000E+00 | 0.000000E+00 | 0.000000E+00 |
| Y8 | 0.000000E+00 | 0.000000E+00 | 0.000000E+00 | 0.000000E+00 | 0.000000E+00 | 0.000000E+00 |
| X8Y | 0.000000E+00 | 0.000000E+00 | 0.000000E+00 | 0.000000E+00 | 0.000000E+00 | 0.000000E+00 |
| X6Y3 | 0.000000E+00 | 0.000000E+00 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 | 0.000000E+00 | 0.000000E+00 |
| Y9 | 0.000000E+00 | 0.000000E+00 | 0.000000E+00 | 0.000000E+00 | 0.000000E+00 | 0.000000E+00 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 0.000000E+00 | 0.000000E+00 | 0.000000E+00 | 0.000000E+00 | 0.000000E+00 | 0.000000E+00 |
| Nradius | 1.000000E+00 | 0.000000E+00 | 1.000000E+00 | 1.000000E+00 | 1.000000E+00 | 1.000000E+00 |

| Coefficient | M1 | M2 | M3 | M4 | M5 | M6 | Image plane |
|---|---|---|---|---|---|---|---|
| Y-decentre | 172.287 | 276.185 | 336.270 | 167.562 | 379.550 | 267.210 | 0.000 |
| X-rotation | −3.535 | −5.840 | 10.868 | 13.825 | 9.306 | 4.657 | 0.000 |

The mirror M5 of the embodiment of the projection optical system 7 of FIG. 5 has no opening for passage of the imaging light 3.

The object field 4 and the mirror M5 are arranged on different sides of a main plane 22. The main plane 22 is defined as a plane being perpendicular to the plane of projection of FIG. 5 and intersecting this plane of projection at the optical axis 16.

The mirrors M1 and M4 on the one hand, and the mirrors M3 and M6, on the other hand, in the projection optical system 7 according to FIG. 5, are arranged back to back.

The mirrors M1, M3 and M6 are concave. The mirror M5 is convex. The mirrors M2 and M4 have a radius of curvature which is so great that they appear virtually to be a planar mirror in FIG. 5.

In the projection optical system 7 according to FIG. 5, an aperture diaphragm or stop may be arranged in the region of a pupil plane 23 between the mirrors M2 and M3.

The central pupil obscuration, in the projection optical system 7 according to FIG. 5, is 4.0%.

The numerical value for the pupil obscuration is produced by the ratio of the area within the exit pupil masked because of the pupil obscuration relative to a total area of an exit pupil of the imaging optical system. A pupil obscuration, which is less than 5%, makes possible a pupil obscured imaging optical system with a particularly high light throughput. Furthermore, the small obscuration according to the disclosure may lead to a small or negligible influence on an imaging quality of the imaging optical system, in particular on the imaging contrast. The pupil obscuration may be less than 10%. The pupil obscuration may, for example, be 4.4% or 4.0%. The pupil obscuration may be less than 4%, may be less than 3%, may be less than 2% and may even be less than 1%. The pupil obscuration of the imaging optical system may be predetermined by one of the mirrors, for example by a through-opening thereof or by an outer edging thereof, or by an obscuration stop or diaphragm, which is arranged in the beam path of the imaging light between the object field and the image field.

The working spacing $d_w$ between the image plane 9 and the portion of the used reflection face of the mirror M5 closest to the image plane is 85 mm in the projection optical system according to FIG. 5. A ratio of this working spacing $d_w$ to the overall length of the projection optical system 7 according to FIG. 5 is 4.25%. The angle of incidence of the individual beams 15 on the mirror M5 in the meridional plane, which is shown in FIG. 5, is a maximum of 15.9°.

The intermediate image plane 20 of the projection optical system 7 of FIG. 5 is arranged near the through-opening 18 in mirror M6 for the passage of the imaging light 3 through the mirror M6. The exit pupil plane 19 in the light path between intermediate image 21 and the image field 8 is located near the reflection of the illumination light 3 at the mirror M5.

To produce a microstructured or nanostructured component, the projection exposure installation 1 is used as follows: Initially, the reflection mask 10, or the reticle and the substrate, or the wafer 11 is prepared. Subsequently, a structure on the reticle 10 is projected onto a light-sensitive layer of the wafer 11 via the projection exposure installation 1. By developing the light-sensitive layer, a microstructure on the wafer 11, and thus the microstructured component, are then produced.

What is claimed is:

1. An imaging optical system, comprising:
a plurality of mirrors configured to image an object field in an object plane into an image field in an image plane along a beam path of imaging light,
wherein:
the imaging optical system has an exit pupil obscuration;
the plurality of mirrors comprises a last mirror in the beam path between the object field and the image field;
the plurality of mirrors comprises a fourth to last mirror in the beam path between the object field and the image field; and
the fourth to last mirror is concave and has no opening to pass the imaging light.

2. The imaging optical system of claim 1, wherein:
the plurality of mirrors comprises a second to last mirror in the beam path between the object field and the image field;

the plurality of mirrors comprises a third to last mirror in the beam path between the object field and the image field; and the beam path between the third to last mirror and the second to last mirror passes the fourth to last mirror at a distance to a normal of a center of the image field that is smaller than a distance of the fourth to last mirror to the normal to the image field.

3. The imaging optical system of claim 1, wherein the imaging optical system has an intermediate image plane in the beam path between the object plane and the image plane.

4. The imaging optical system of claim 3, wherein the intermediate image is located a spatial distance from the last mirror that is more than 10% of a spatial distance between the object plane and the image plane.

5. The imaging optical system of claim 3, wherein:

the plurality of mirrors comprises a third to last mirror in the beam path between the object field and the image field; and the intermediate image is located in the beam path in front of the third to last mirror.

6. The imaging optical system of claim 5, wherein the intermediate image plane is located in the beam path in front of the fourth to last mirror.

7. The imaging optical system of claim 6, wherein:

the plurality of mirrors comprises a fifth to last mirror in the beam path between the object field and the image field; and the intermediate image plane is in the beam path between the fifth to last mirror and the fourth to last mirror.

8. The imaging optical system of claim 1, wherein the imaging optical system has an intermediate pupil plane in the beam path between the object plane and the image plane, and the intermediate pupil plane is in the vicinity of one of the plurality of mirrors.

9. The imaging optical system of claim 1, wherein the plurality of mirrors includes exactly six mirrors.

10. The imaging optical system of claim 1, wherein the imaging optical system has an image side numerical aperture of at least 0.4.

11. The imaging optical system of claim 1, wherein the image field is larger than one mm$^2$.

12. The imaging optical system of claim 1, wherein the image field has dimensions of at least 2 mm and at least 26 mm, and the image field is rectangular or arc-shaped.

13. The imaging optical system of claim 1, wherein a maximum angle of incidence for a chief ray of the imaging light at a central object point on the fourth to last mirror is at most 10°.

14. The imaging optical system of claim 1, wherein a maximum angle of incidence for the imaging light on the fourth to last mirror in a meridional plane of the imaging optical system is at most 10°.

15. The imaging optical system of claim 1, wherein the imaging optical system has a maximum wave front error of 47 m$\lambda$.

16. The imaging optical system of claim 1, wherein the imaging optical system has a maximum distortion of 35 nm.

17. The imaging optical system of claim 1, wherein the imaging optical system is a microlithography projection optical system.

18. A projection exposure installation, comprising:

an imaging optical system comprising a plurality of mirrors configured to image an object field in an object plane into an image field in an image plane along a beam path of imaging light; and an illumination optical system configured to guide illumination light to the object field of the imaging optical system, wherein:

the imaging optical system has an exit pupil obscuration;

the plurality of mirrors comprises a last mirror in the beam path between the object field and the image field;

the plurality of mirrors comprises a fourth to last mirror in the beam path between the object field and the image field;

the fourth to last mirror is concave and has no opening to pass the imaging light; and the projection exposure installation is a microlithography projection exposure installation.

19. The projection exposure installation of claim 18, wherein the projection exposure installation is configured to operate at a wavelength of between 5 nm and 30 nm.

20. A method, comprising:

providing a microlithography projection exposure installation, comprising:

an imaging optical system comprising a plurality of mirrors configured to image an object field in an object plane into an image field in an image plane along a beam path of imaging light; and an illumination optical system configured to guide illumination light to the object field of the imaging optical system; and using the projection exposure installation to project a structure of a reticle onto a light-sensitive layer of a wafer, wherein:

the imaging optical system has an exit pupil obscuration;

the plurality of mirrors comprises a last mirror in the beam path between the object field and the image field;

the plurality of mirrors comprises a last mirror in the beam path between the object field and the image field;

the plurality of mirrors comprises a fourth to last mirror in the beam path between the object field and the image field;

the fourth to last mirror is concave and has no opening to pass the imaging light; and the projection exposure installation is a microlithography projection exposure installation.

* * * * *

UNITED STATES PATENT AND TRADEMARK OFFICE
CERTIFICATE OF CORRECTION

PATENT NO. : 8,610,877 B2  Page 1 of 1
APPLICATION NO. : 13/197445
DATED : December 17, 2013
INVENTOR(S) : Hans-Juergen Mann et al.

It is certified that error appears in the above-identified patent and that said Letters Patent is hereby corrected as shown below:

In the Specifications

Col. 12, line 34, delete "N radius" and insert -- Nradius --.

In the Claims

Col. 16, line 47-48, Claim 20, below "field;" delete "the plurality of mirrors comprises a last mirror in the beam path between the object field and the image field;".

Signed and Sealed this
Twenty-fifth Day of March, 2014

Michelle K. Lee
*Deputy Director of the United States Patent and Trademark Office*